United States Patent
Oh et al.

(10) Patent No.: US 11,201,072 B2
(45) Date of Patent: Dec. 14, 2021

(54) PURGE NOZZLE MODULE FOR LOAD PORT

(71) Applicant: AE CO., LTD., Gyeonggi-do (KR)

(72) Inventors: She Hyun Oh, Gyeonggi-do (KR); Joung Youn Kim, Gyeonggi-do (KR)

(73) Assignee: AE CO., LTD., Gyeonggi-Do (KR)

( * ) Notice: Subject to any disclaimer, the term of this patent is extended or adjusted under 35 U.S.C. 154(b) by 26 days.

(21) Appl. No.: 16/723,085

(22) Filed: Dec. 20, 2019

(65) Prior Publication Data

US 2020/0321231 A1    Oct. 8, 2020

(30) Foreign Application Priority Data

Apr. 3, 2019   (KR) .................. 10-2019-0039078

(51) Int. Cl.
*H01L 21/673*   (2006.01)

(52) U.S. Cl.
CPC .............................. *H01L 21/67389* (2013.01)

(58) Field of Classification Search
CPC ............. H01L 21/673; H01L 21/67389; H01L 21/67393
See application file for complete search history.

(56) References Cited

U.S. PATENT DOCUMENTS

| | | | | |
|---|---|---|---|---|
| 5,398,481 A * | 3/1995 | Takeuchi | ........ | H01L 21/67772 53/405 |
| 5,988,233 A * | 11/1999 | Fosnight | ........ | H01L 21/67393 141/63 |
| 6,164,664 A * | 12/2000 | Fosnight | ........ | F16J 15/025 277/635 |
| 6,368,411 B2 * | 4/2002 | Roberson, Jr | .... | H01L 21/67017 118/715 |
| 6,796,763 B2 * | 9/2004 | Miyajima | ........ | H01L 21/67772 414/805 |
| 6,808,352 B2 * | 10/2004 | Seita | ........ | H01L 21/67379 414/217.1 |
| 6,846,380 B2 * | 1/2005 | Dickinson | ........ | B08B 3/04 118/719 |
| 7,328,727 B2 * | 2/2008 | Tieben | ........ | H01L 21/67379 141/11 |

(Continued)

FOREIGN PATENT DOCUMENTS

| | | |
|---|---|---|
| JP | 2004-345715 A | 12/2004 |
| JP | 2016-039297 A | 3/2016 |

(Continued)

OTHER PUBLICATIONS

Office action dated Mar. 9, 2021 from Japan Intellectual Property Office in a counterpart Japanese Patent Application No. 2019-0237170 (all the cited references are listed in this IDS.) (English translation is also submitted herewith.).

*Primary Examiner* — Nicolas A Arnett
(74) *Attorney, Agent, or Firm* — The PL Law Group, PLLC (57) ABSTRACT

A purge nozzle module for supplying nitrogen (N2) to a semiconductor wafer processing apparatus includes a nozzle body with a purge hole formed at a center thereof, and a vacuum pad combined with an upper side of the nozzle body, having a through hole connected to the purge hole formed therethrough, and making close contact with a bottom of a FOUP (Front Opening Unified Pod) by a vacuum pressure.

17 Claims, 6 Drawing Sheets

(56) References Cited

U.S. PATENT DOCUMENTS

| | | | |
|---|---|---|---|
| 8,596,312 B2 * | 12/2013 | Natsume | H01L 21/67379 |
| | | | 141/98 |
| 9,174,253 B2 * | 11/2015 | Natsume | B08B 9/093 |
| 9,916,997 B2 * | 3/2018 | Morihana | H01L 21/67393 |
| 9,997,388 B2 * | 6/2018 | Smith | B65D 85/38 |
| 10,014,200 B2 * | 7/2018 | Murata | H01L 21/67389 |
| 2014/0041755 A1 * | 2/2014 | Chou | H01L 21/67393 |
| | | | 141/113 |

FOREIGN PATENT DOCUMENTS

| | | |
|---|---|---|
| KR | 10-0702830 B1 | 4/2007 |
| KR | 10-1545243 B1 | 8/2015 |
| KR | 10-1575652 B1 | 12/2015 |

\* cited by examiner

PURGE NOZZLE MODULE FOR LOAD PORT

CROSS-REFERENCE TO RELATED APPLICATIONS

This application claims priority to Korean Patent Application No. 10-2019-0039078, filed on Apr. 3, 2019, and all the benefits accruing therefrom under 35 U.S.C. § 119, the content of which in its entirety is herein incorporated by reference.

BACKGROUND

1. Technical Field

Exemplary embodiments of the inventive concept relate to a purge nozzle module. More particularly, exemplary embodiments of the inventive concept relate to a purge nozzle module for providing nitrogen ($N_2$) to a semiconductor wafer processing apparatus.

2. Description of the Related Art

A front-opening interface mechanical standard (FIMS) system is a standard proposed by the Semiconductor Equipment and Materials International (SEMI) in a semiconductor manufacturing process.

The FIMS system uses a wafer processing apparatus called a load port for automatically transferring a wafer or a reticle to the FIMS system.

The load port is an interface device that delivers a FOUP (Front Opening Unified Pod) in which the wafer is stored to a transfer device such as a robot of the FIMS system.

Here, the FOUP includes a gate for carrying in and out of the wafer formed at a front surface, and has a door capable of opening the gate. A door part of the load port and the door of the FOUP are opened simultaneously after the door part and the door are in close contact. The wafer in the FOUP is supplied into a semiconductor manufacturing apparatus through the gate. Thereafter, the wafer which has been various processed is received back into the FOUP from inside the semiconductor manufacturing apparatus.

Although the inside of the semiconductor manufacturing apparatus is maintained in a predetermined gas atmosphere suitable for the processing of the wafer, when the wafer is sent from the FOUP into the semiconductor manufacturing apparatus, an internal space of the FOUP and an internal space of the semiconductor manufacturing apparatus are connected with each other.

Therefore, when the internal space of the FOUP in which the wafer stored has lower in cleanliness than the internal space of the semiconductor manufacturing apparatus, gas inside the FOUP may enter the semiconductor manufacturing apparatus and may adversely affect the gas atmosphere inside the semiconductor manufacturing apparatus.

Figure 1:
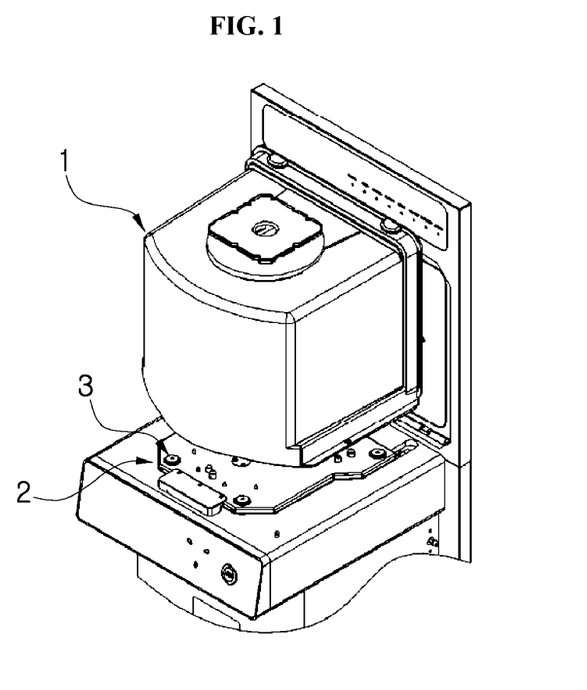
FIG. 1 is a perspective view illustrating a purge nozzle provided on a stage of a conventional load port.

In order to cope with such a problem, as shown in FIG. 1, when the door of the FOUP 1 is opened in the door part of the load port to connect the internal space of the FOUP 1 and the internal space of the semiconductor manufacturing apparatus, a purge nozzle 3 for blowing a predetermined gas (for example, nitrogen ($N_2$), an inert gas, or the like) into the FOUP 1 is provided on the stage 2 of the load port.

For example, Korean Patent Publication No. 10-1545243 discloses an example in which a purge nozzle is raised by a regulator such as a solenoid valve when the FOUP is seated on the stage for close contact to a port under the FOUP.

According to the purge nozzle using a cylinder lifting method as described above, since a purge process is performed in a state in which the purge nozzle is in contact with the port at a bottom of the FOUP, it is necessary to ensure good airtightness in the state of contacting the port and the purge nozzle. If the type or shape of the port is different depending on a type of FOUP, there is a problem that a good connection state for securing high airtightness between the purge nozzle and the port cannot be secured.

In addition, if the purge nozzle is raised in the state that the FOUP is not seated in a correct position on the stage, a tip of the purge nozzle is in contact with a periphery of the port at the bottom of the FOUP, and there is also a risk that the periphery of the port or the tip of the purge nozzle may be worn or the wafer inside may be damaged as the FOUP is tilted to one side.

SUMMARY

One or more exemplary embodiment of the inventive concept provides a purge nozzle module for a load port capable of sealing a port on a bottom of a FOUP (Front Opening Unified Pod).

One or more exemplary embodiments of the inventive concept also provide a purge nozzle module for a load port capable of preventing a problem of leakage of purge gas due to a poor loading of the FOUP.

One or more exemplary embodiments of the inventive concept also provide a purge nozzle module for a load port capable of close contacting a front end of a purge nozzle with the port on the bottom of the FOUP by a vacuum pressure.

According to an exemplary embodiment of the inventive concept, a purge nozzle module for a load port includes a nozzle body with a purge hole formed at a center thereof, and a vacuum pad combined with an upper side of the nozzle body, having a through hole connected to the purge hole formed therethrough, and making close contact with a bottom of a FOUP (Front Opening Unified Pod) by a vacuum pressure.

In an exemplary embodiment, the nozzle body may have a gas injection hole connected to the purge hole and formed on one side thereof.

In an exemplary embodiment, the nozzle body may further include at least one exhaust hole spaced apart from the gas injection hole by a predetermined gap.

In an exemplary embodiment, the vacuum pad may have a vacuum hole connected to the exhaust hole.

In an exemplary embodiment, the vacuum pad may further include a pair of sidewalls spaced apart from each other by a predetermined distance along a circumference of the through hole, and a bottom surface formed between the pair of sidewalls and having the vacuum hole.

In an exemplary embodiment, the pair of sidewalls may form concentric circles having different diameters with respect to the through hole as a center.

In an exemplary embodiment, the nozzle body may include a base member with the gas injection hole formed one side thereof, and a support member which is combined with the base member, has the purge hole connected to the gas injection hole formed through a middle thereof, and is combined with the vacuum pad at an upper side thereof.

In an exemplary embodiment, the nozzle body may further include at least one exhaust hole spaced apart from the gas injection hole by a predetermined gap, and a second vacuum exhaust hole formed through a side of the purge hole and connected with the exhaust hole.

In an exemplary embodiment, the nozzle body may further include a combining member combined to a stage to surround an outer side of an upper end of the base member and to guide a lifting direction of the base member.

In an exemplary embodiment, the base member may include a body having a block shape, and a first seating groove formed on an upper surface of the body. The support member may be seated on the first seating groove.

In an exemplary embodiment, the base member may include a first boss protruding upward from a center of the first seating groove to be connected to the gas injection hole and having a hollow.

In an exemplary embodiment, the base member may further include at least one exhaust hole formed spaced apart from the gas injection hole by a predetermined gap, and a first vacuum exhaust hole formed at a side of the first boss to be connected to the exhaust hole.

In an exemplary embodiment, the base member may further include a pair of wing portions protruding from both sides of the body.

In an exemplary embodiment, the base member may further include a guide pin installed vertically through the wing portion, and an elastic member installed to surround a lower end of the guide pin to elastically support the base member.

In an exemplary embodiment, the support member may further include a seating portion inserted into the first seating groove, an extending portion formed to extend a width of the seating portion at an upper portion of the seating portion, and a second seating groove formed on an upper surface of the extending portion and into which the vacuum pad is inserted.

In an exemplary embodiment, the base member may further include a first boss protruding upward from a center of the first seating groove to be connected to the gas injection hole and having a hollow. The support member may further include a second boss protruding upward from a center of the second seating groove and having the purge hole into which the first boss is inserted.

In an exemplary embodiment, the base member may further include at least one exhaust hole formed spaced apart from the gas injection hole by a predetermined gap, and a first vacuum exhaust hole formed at a side of the first boss to be connected to the exhaust hole. The support member may further include a second exhaust hole formed at a side of the second boss to be connected to the first vacuum exhaust hole In an exemplary embodiment, the support member may further include an inner flange groove formed along a lower circumference of an outer circumferential surface of the second boss, and an outer flange groove formed along a lower edge of an outer edge of the second seating groove.

In an exemplary embodiment, the combining member may include a combining body having a rectangular plate shape, a receiving hole formed through the combining body, and a plurality of guide pin groove formed on a bottom surface of the combining body.

In an exemplary embodiment, the vacuum pad may include an inner sidewall and an outer sidewall formed spaced apart from each other in a radial direction along a circumference of the through hole, a bottom surface formed between the inner sidewall and the outer sidewall, a vacuum hole formed at the bottom surface, an inner flange protruded inward along a circumference of the inner sidewall and inserted into the inner flange groove, an outer flange protruded outward along a circumference of the outer sidewall and inserted into the outer flange groove, and an inserting portion protruded downward along a circumference of the vacuum hole.

According to a purge nozzle module for a load port of the present invention, manufacturing cost is reduced because it does not require an actuator, such as a conventional solenoid, and time and cost required for assembly and replacement can be reduced because a pre-assembled module is mounted on a stage.

In addition, according to the purge nozzle module for the load port of the present invention, since a tip of the purge nozzle is in close contact with a periphery of the port of the FOUP by vacuum pressure, airtightness is improved, and it is possible to maintain a stable connection state.

In addition, according to the purge nozzle module for the load port of the present invention, compared with a conventional lifting method of a cylinder such as a solenoid, shock, abrasion or damage applied to the FOUP is prevented, so that possibility of failure is low and durability is improved.

It is to be understood that both the foregoing general description and the following detailed description are exemplary and explanatory and are intended to provide further explanation of the invention as claimed.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Hereinafter, the inventive concept will be explained in detail with reference to the accompanying drawings. In describing the various embodiments of the present invention, the same reference numerals will be used for the elements having the same technical features.

Figure 2:
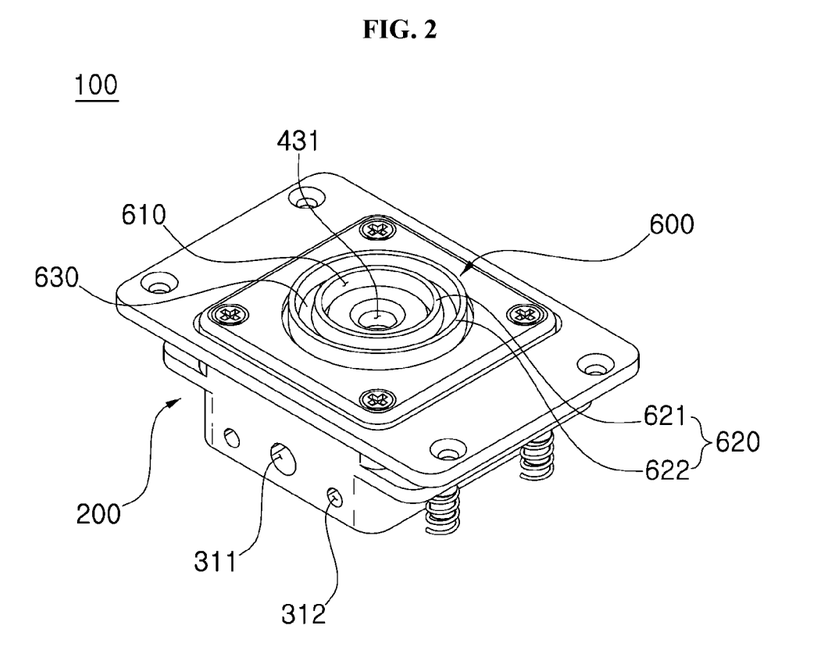
FIG. 2 is a perspective view illustrating a purge nozzle module for a load port according to an exemplary embodiment of the inventive concept.
Figure 3:
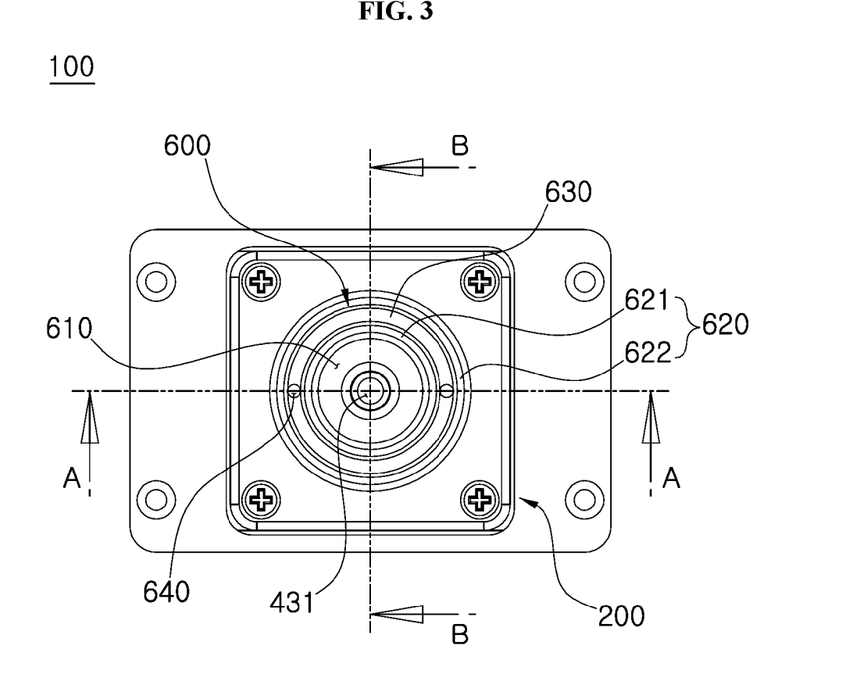
FIG. 3 is a perspective view illustrating a purge nozzle module for a load port according to an exemplary embodiment of the inventive concept.

As described in FIGS. 2 and 3, the purge nozzle module for the load port (hereinafter, 'fuzzy nozzle module') 100 according to an embodiment of the present invention includes a nozzle body 200 having a cube block shape, a vacuum pad 600 provided on an upper side of the nozzle body 200.

A purge hole 431 for supplying purge gas, such as N2, inert gas, or the like is formed in a center of the upper side of the nozzle body 200 the lower side of the nozzle body 200 is injected purge gas from the outside Gas injection hole 311 is formed. A gas injection hole 311 through which purge gas is injected from the outside is formed at a lower side of the nozzle body 200. In addition, at least one exhaust hole 312 is formed near the gas injection hole 311 at a predetermined interval so as to form a vacuum in a contact area of the vacuum pad 600.

The vacuum pad 600 has a ring shape in which a through hole 610 is formed in the center of the ring shape. The vacuum pad 600 is detachably combined to the upper side of the nozzle body 200. The through hole 610 of the vacuum pad 600 is connected with the purge hole 431 of the nozzle body 200. In addition, the vacuum pad 600 includes a pair of sidewalls 620 which are formed spaced apart from each other along a circumference of the through hole 610 with respect to the through hole 610, a bottom surface 630 and formed between a pair of sidewalls 620 and at least one vacuum hole 640 formed in the bottom surface 630. The pair of sidewalls 620 form concentric circles of different diameters along the circumference of the through hole 610. Hereinafter, the sidewall 620 formed close to the through hole 610 will be referred to as an 'inner sidewall 621', and the sidewall 620 formed outside the inner sidewall 621 will be referred to as an 'outer sidewall 622'.

When the nozzle body 200 and the vacuum pad 600 are combined, the purge hole 431 of the nozzle body 200 is exposed to the outside through the through hole 610 of the vacuum pad 600. The inner sidewall 621 and the outer sidewall 622 of the vacuum pad 600 surrounds the purge hole 431.

The gas injection hole 311 of the nozzle body 200 is in connected with the purge hole 431 through a flow path inside, and thus purge gas injected through the gas injection hole 311 to the nozzle body 200 is discharged through the purge hole 431. When the FOUP (refers to 20 of FIG. 9) is seated on a stage (refers to 10 of FIGS. 8 and 9) of a load port, a port (refers to 21 of FIG. 9) provided on the bottom of the FOUP 20 is connected the purge hole 431. The purge gas discharged through the purge hole 431 is supplied into the FOUP 20 through the port 21.

Meanwhile, the exhaust hole 312 of the nozzle body 200 is connected with the vacuum hole 640 of the vacuum pad 600 through another flow path inside the nozzle body 200. That is, the flow path connected to the exhaust hole 312 and the vacuum hole 640 is formed separately from the flow path connected to the gas injection hole 311 and the purge hole 431 described above. When the FOUP 20 is seated in the stage 10 of the load port, a top of the inner sidewall 621 and a top of the outer sidewall 622 of the vacuum pad 600 are make close contact with the bottom of the FOUP 20 along a circumference of the port 21. At this time, a vacuum region is formed in a space between the inner sidewall 621 and the outer sidewall 622 of the vacuum pad 600 through the vacuum hole 640 and the exhaust hole 312. The vacuum pad 600 is more closely contacted to the bottom of the FOUP 20 by the vacuum pressure, thereby ensuring airtightness for preventing leakage of the purge gas.

Figure 4:
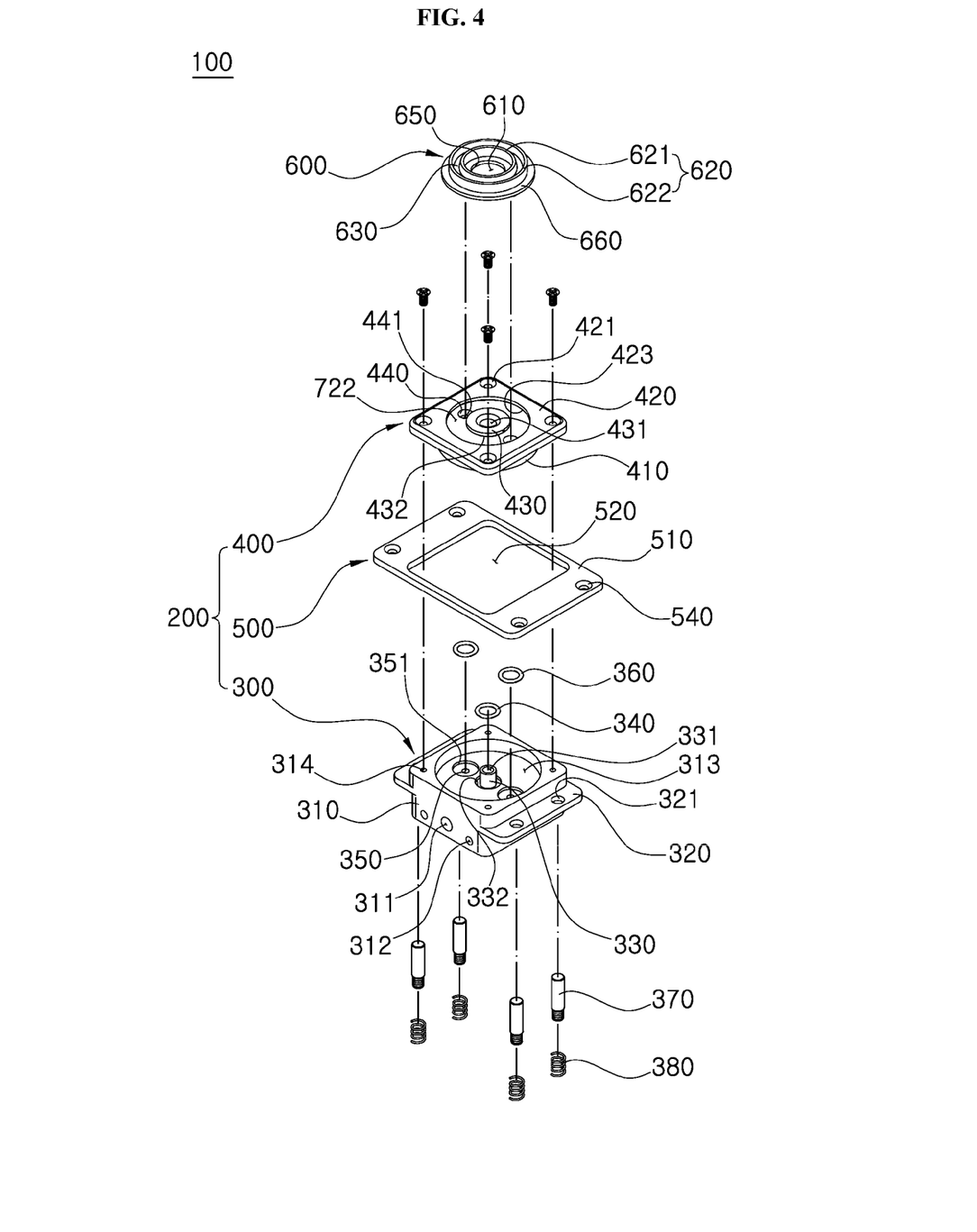
FIGS. 4 and 5 are exploded perspective views of FIG. 2.
Figure 5:
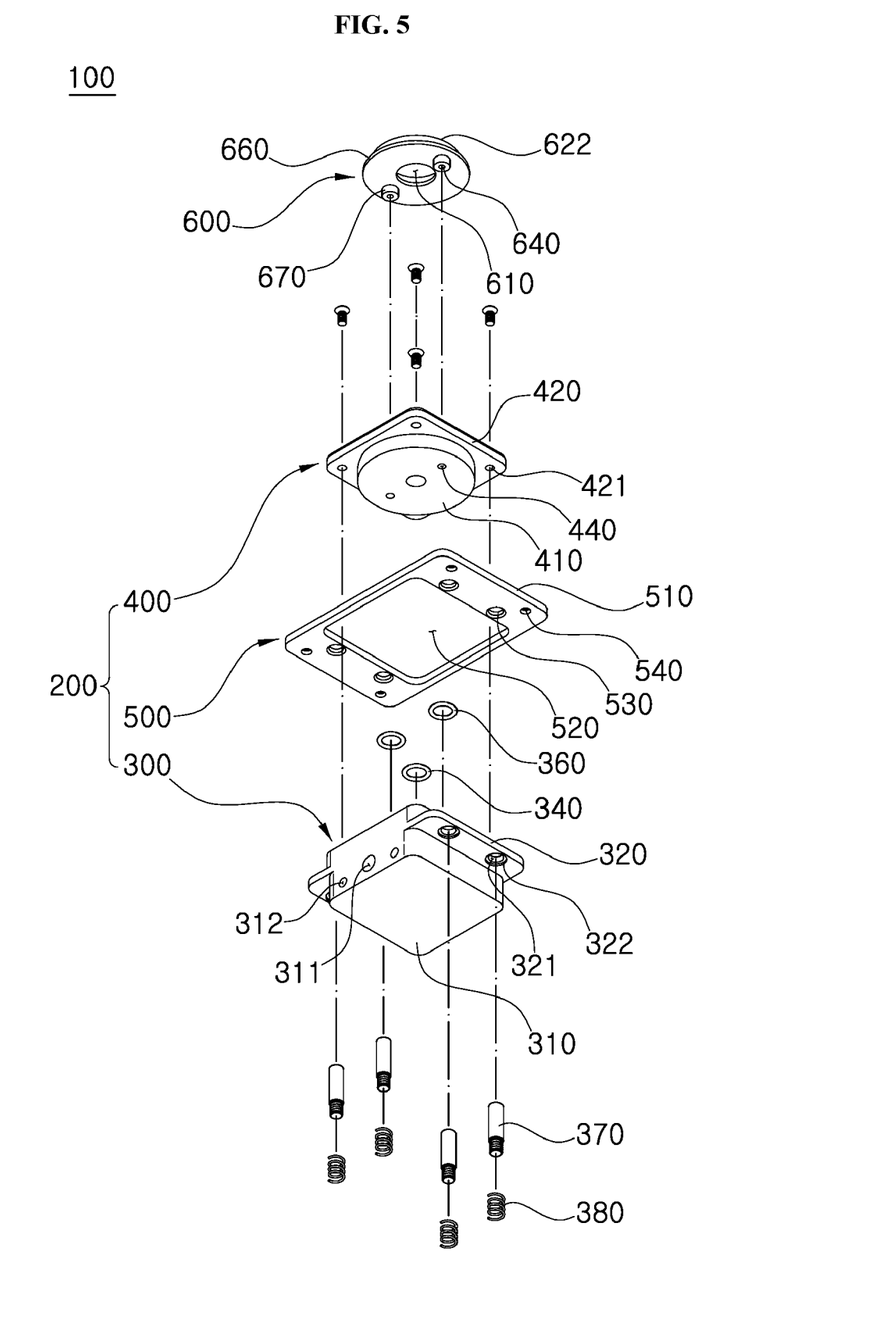

As shown in FIGS. 4 and 5, the nozzle body 200 includes a base member 300, on which the gas injection hole 311 and the exhaust hole 312 is formed, and a support member 400 combined with an upper side of the base member 300 wherein the vacuum pad 600 is combined with the support member 400.

At this time, the purge hole 431 and a second vacuum exhaust hole 440 is formed at the support member 400. When the base member 300 and the support member 400 are combined with each other, the purge hole 431 is connected with the gas injection hole 311, and the second vacuum exhaust hole 440 is connected with the exhaust hole 312.

The base member 300 includes a body 310 in the form of a hexahedron block, and a pair of wings 320 protruding outward from both sides of the body 310. The base member 300 includes a body 310 having a hexahedron block shape and a pair of wings 320 protruding outward from both sides of the body 310. The gas injection hole 311 and at least one exhaust hole 312 are formed at a side of the body 310. As an example, as shown in the drawing, a pair of exhaust holes 312 may be formed on each side of each of the gas injection holes 311 at a predetermined interval.

A first seating groove 313 is formed on the upper side of the body 310. A seating portion 410 of the support member 400 to be described later is seated on the first seating groove 313. The first seating groove 313 and the seating portion 410 may be formed in a circular shape as shown in the figure, but not limited thereto. The shape of the first seating groove 313 and the seating portion 410 may be appropriately selected as necessary, such as a square.

A first boss 330 having a hollow 331 in the center of the first seating groove 313 is formed to protrude upward. The hollow 331 of the first boss 330 is connected with the gas injection hole 311 at a lower end thereof. Therefore, the purge gas injected through the gas injection hole 311 is flowed into the hollow 331 of the first boss 330.

A first O-ring groove 332 is formed along a lower periphery of the first boss 330. The first O-ring 340 is inserted into the first O-ring groove 332. When the base member 300 and the support member 400 to be described later are combined each other, the first boss 330 of the base member 300 is inserted into the purge hole 431 of the support member 400. The first O-ring 340 serves to prevent a leakage of the purge gas through a gap between the base member 300 and the support member 400.

A pair of first vacuum exhaust holes 350 are formed one by one on both sides of the first boss 330. A lower end portion of the first vacuum exhaust hole 350 is connected with the exhaust hole 312, and thus, a vacuum may be formed in the first vacuum exhaust hole 350 through the exhaust hole 312.

A second O-ring groove 351 is formed along an upper circumference of the first vacuum exhaust hole 350. The second O-ring 360 is inserted into the second O-ring groove 351. When the base member 300 and the support member 400 to be described later are combined each other, the first vacuum exhaust hole 350 of the base member 300 is connected with the second vacuum exhaust hole 440 of the support member 400. The second O-ring 360 serves to prevent leakage of vacuum exhaust through the gap between the base member 300 and the support member 400.

At least one guide pin inserting hole 321 is formed in the wing 320 of the base member 300. The lower end of the guide pin 370 is combined to a first fastening groove 12 (refers to FIG. 9) of the stage 10 by passing through the guide pin inserting hole 321. An elastic member supporting groove 322 is formed on a bottom of the wing 320 along a circumference of the guide pin inserting hole 321. An elastic member insertion groove 13 (refer to FIG. 9) is formed on an upper portion of the first fastening groove 12. An elastic member 380 such as a coil spring is installed to surround an outer peripheral surface of the lower end of the guide pin 370. An upper end of the elastic member 380 is supported by the elastic member support groove 322. A lower end of the elastic member 380 is inserted into the elastic member insertion groove 13 of the stage 10 to elastically support the base member 300.

The wing 320 of the base member 300 is capable of lifting along the guide pin 370. When the base member 300 is lowered by an external force, the elastic member 380 is compressed. When the external force is removed, the base member 300 is raised along the guide pin 370 by elastic restoring force of the elastic member 380. Thus, when the FOUP 20 is seated on the stage 10, the elastic member 380 absorbs the shock applied to the nozzle body 200.

The support member 400 is combined to the upper side of the body 310 of the base member 300.

The support member 400 is combined with an upper side of the base member 300 to serve to support the vacuum pad 600. The support member 400 includes the seating portion 410 having a circular block shape and inserted into the first seating groove 313 of the body 310 of the base member 300, and an extending portion 420 having a rectangular block shape with extended width formed on an upper side of the seating portion 410

The support member 400 has a combining hole 421 formed at a corner of an upper side of the extending portion 420, respectively. A combining groove 314 corresponding to the combining hole 421 is formed at a corner of an upper side of the body 310 of the base member 300, respectively. Therefore, the base member 300 and the support member 400 may be combined with each other by a fastener such as a bolt that passes through the combining hole 421 of the support member 400 and combined with the combining groove 314 of the base member 300.

A second seating groove 422 for the inserting of the vacuum pad 600 to be described later is formed on an upper side of the extending portion 420. A second boss 430 having a purge hole 431 is formed to protrude upward at the center of the second seating groove 422. When the base member 300 and the support member 400 are combined with each other, the first boss 330 of the body 310 of the base member 300 is inserted into the purge hole 431 of the second boss 430, so that the hollow 331 of the first boss 330 and the purge hole 431 of the second boss 430 are connected with each other. Therefore, the purge gas injected into the gas injection hole 311 of the base member 300 flows into the purge hole 431 of the second boss 430 through the hollow 331 of the first boss 330.

The second vacuum exhaust hole 440 is formed through a bottom surface of the second seating groove 422 at both sides of the second boss 430. When the base member 300 and the support member 400 are combined with each other, the first vacuum exhaust hole 350 of the body 310 of the base member 300 is connected with the second vacuum exhaust hole 440 of the support member 400. Therefore, vacuum may be formed at the second vacuum exhaust hole 440 through the first vacuum exhaust hole 350 and the exhaust hole 312.

An inserting groove 441 is formed to extend along an upper circumference of the second vacuum exhaust hole 440. When the vacuum pad 600, which will be described later, is mounted in the second seating groove 422, an inserting portion 670 protruding to a bottom of the vacuum pad 600 is inserted into the inserting groove 441.

In addition, an inner flange groove 432 is formed along a lower periphery of an outer circumference of the second boss 430. An outer flange groove 423 is formed along a lower end of an outer edge of the second seating groove 422. The inner flange groove 432 and the outer flange groove 423 are for combination of the vacuum pad 600. An inner flange 650 and an outer flange 660 of the vacuum pad 600 to be described later are inserted into the inner flange groove 432 and the outer flange groove 423, respectively.

The vacuum pad 600 is made of an elastic material, such as rubber or silicone, synthetic resin. The vacuum pad 600 includes the through hole 610 formed through a center thereof, the inner sidewall 621 and the outer sidewall 622 formed to protrude upwardly at predetermined intervals along a circumference of the through hole 610, the bottom surface 630 formed between inner sidewall 621 and outer sidewall 622, and at least one vacuum hole 640 formed through the bottom surface 630.

At this time, an upper surface of the inner sidewall 621 and an upper surface of the outer sidewall 622 are flat. An outer surface of the inner sidewall 621 is formed to be inclined outwardly. An inner surface of the outer side wall 622 is formed to be inclined outwardly. That is, a space between the inner sidewall 621 and the outer sidewall 622 forms a tapered shape that becomes narrower in width toward a bottom in the cross section.

In addition, the inner flange 650 is formed to protrude inward along the circumference of the inner side wall 621. The outer flange 660 protrudes outward along the circumference of the outer sidewall 622. When the vacuum pad 600 is mounted in the second seating groove 422 of the support member 400, the inner flange 650 of the vacuum pad 600 is inserted into the inner flange groove 432 of the support member 400, and the outer flange 660 is inserted into the outer flange groove 423. At this time, the second boss 430 of the support member 400 is exposed through the through hole 610 of the vacuum pad 600. The purge gas introduced into the purge hole 431 of the second boss 430 through the gas injection hole 311 of the body 310 of the base member 300 is discharged through the through hole 610 of the vacuum pad 600.

On the other hand, the insertion portion 670 is formed protruding downward along the circumference of the vacuum hole 640 at the bottom of the vacuum pad 600. The inserting portion 670 is inserted into the insertion groove 441 of 400 when the inserting portion 670 is combined with the support member 400. At this time, the vacuum hole 640 of the vacuum pad 600 and the second vacuum exhaust hole 440 of the support member 400 are connected with each other. A space between the inner sidewall 621 and the outer sidewall 622 is vacuumed through the vacuum hole 640 and the second vacuum exhaust hole 440, the first vacuum exhaust hole 350 and the exhaust hole 312.

The combining member 500 is for combining the base member 300 on the stage 10. The combining member 500 includes a rectangular plate-shaped combining body 510, a receiving hole 520 formed through the combining body 510.

A plurality of guide pin grooves 530 is formed at a bottom surface of the combining body 510 and at both sides of the receiving hole 520. A plurality of fastening holes 540 are formed through an upper edge of the combining body 510.

The combining member 500 is seated on a step (14, see FIG. 9) formed on both sides of the mounting groove (refers to 11 of FIG. 9) of the stage 10. The combining member 500 is combined with the stage 10 by a fastener such as a bolt that is fastened to a second fastening groove (refers to 15 of FIG. 9) of the step 14 by passing through the fastening hole 540. At this time, an upper end of the base member 300 and the support member 400 protrudes upward through the receiving hole 520 of the combining member 500, and the combining member 500 is combined with the stage 10 to surround the outside of the upper end of the base member 300.

A top of the guide pin 370 combined with the first fastening groove 12 of the stage 10 through the wing 320 of the base member 300 is inserted into the guide pin groove 530, and the base member 300 is elastically supported by the elastic member 380 which is combined with outer circumference of the guide pin 370.

When the elastic member 380 is compressed and extended, the base member 300 and the support member 400 are elevated through the receiving hole 520 of the combining member 500. Therefore, the combining member 500 also serves to guide a lifting direction of the base member 300, the support member 400, and the vacuum pad 600.

Figure 6:
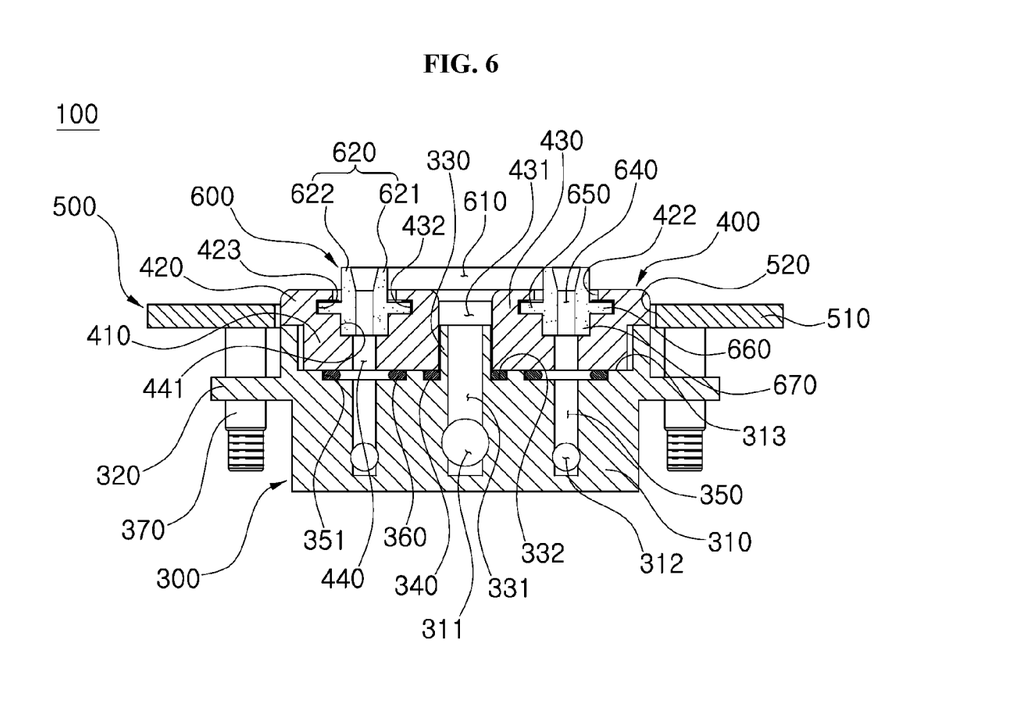
FIG. 6 is a cross-sectional view in A-A' direction of FIG. 3.

As shown in FIG. 6, the exhaust hole 312 of the body 310 of the base member 300 is sequentially connected to the first vacuum exhaust hole 350, the second vacuum exhaust hole 440 of the support member 400 and the vacuum hole 640 of the vacuum pad 600.

Therefore, when evacuating through the exhaust hole 312, a vacuum region is formed in the space between the inner side wall 621 and the outer side wall 622 of the vacuum pad 600 in which the exhaust hole 312 is formed, so that the vacuum pad 600 is in close contact with the peripheral portion of the port 21 of the bottom of the FOUP 20 by the vacuum pressure to improve the airtightness.

Figure 7:
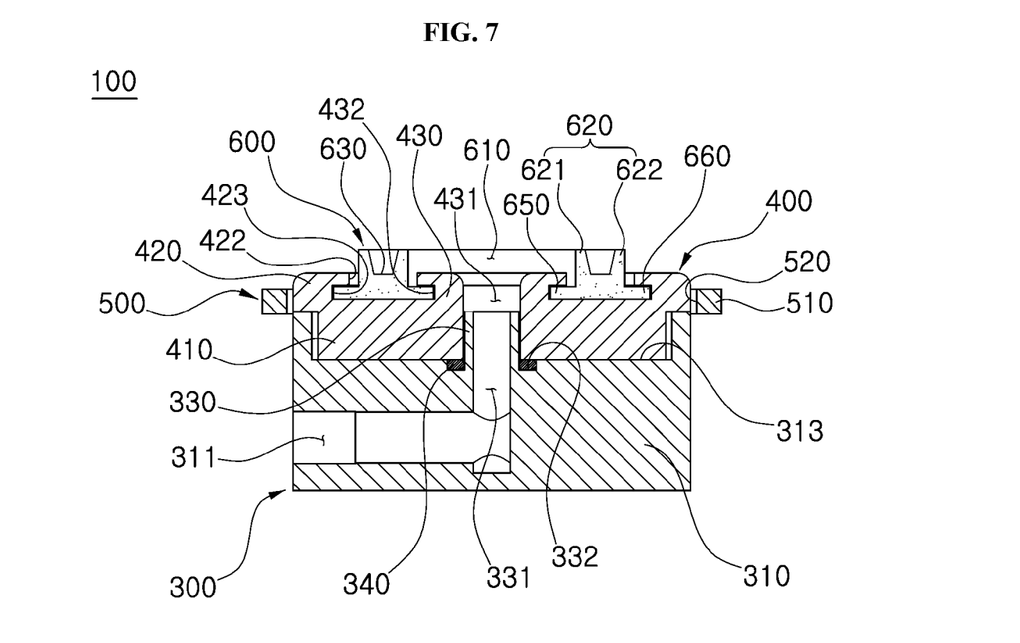
FIG. 7 is a cross-sectional view in B-B' direction of FIG. 3.

In addition, as shown in FIGS. 6 and 7, the gas injection hole 311 of the body 310 of the base member 300 is sequentially connected to the hollow 331 of first boss 330, the purge hole 431 of the support member 400 and the through hole 610 of the vacuum pad 600.

Therefore, when the purge gas is injected through the gas injection hole 311, the purge gas is discharged through the purge hole 431 of the support member 400 and the through hole 610 of the vacuum pad 600. The purge gas discharged in this way is supplied into the FOUP 20 through the port 21 of the FOUP 20.

Figure 8:
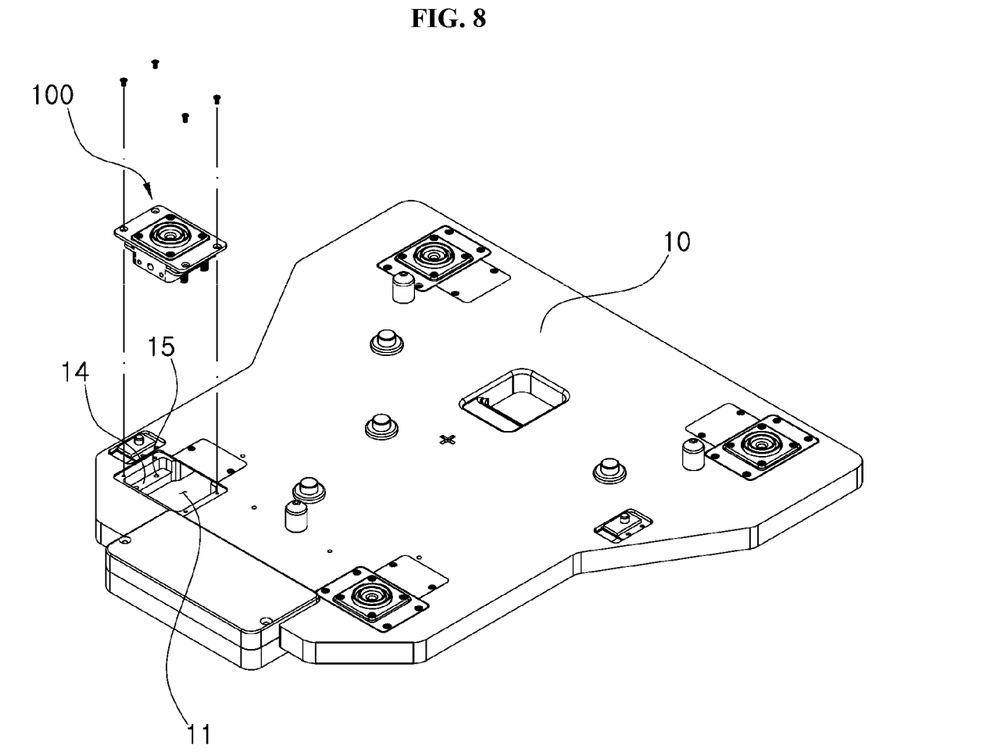
FIG. 8 is a perspective view of a stage equipped with a purge nozzle module for a load port according to an exemplary embodiment of the inventive concept.

As shown in FIG. 8, the purge nozzle module according to an embodiment of the present invention is inserted and mounted in the mounting groove 11 at the upper surface of the stage 10, respectively. At this time, the wing 320 of the base member 300 is seated on the step 14 of the mounting groove 11, and fasteners such as bolts are fastened to the second fastening groove 15 of the step 14 by passing through the wing 320 through the fastening hole 540. Therefore, the assembly of the purge nozzle module 100 is simple, and can be easily replaced when necessary.

On the other hand, when mounting the purge nozzle module 100 on the stage 10, the guide pin 370 is combined with the first fastening groove 12 of the stage 10, for example by screw coupling method. The elastic member 380 is inserted into the elastic member inserting groove (refers to 13 of FIG. 9) above the first fastening groove 12 (see FIG. 9) to elastically support the wing 320 of the base member 300.

Figure 9:
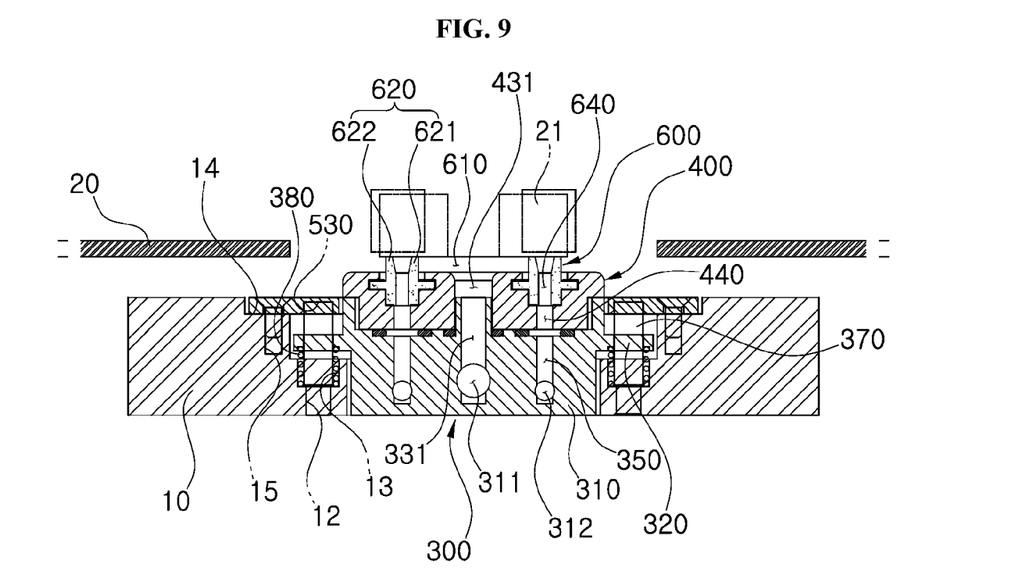
FIG. 9 is a using state diagram of a purge nozzle module for a load port according to an exemplary embodiment of the inventive concept.

FIG. 9 is a using state diagram of a purge nozzle module for a load port according to an exemplary embodiment of the inventive concept. As shown, when the FOUP 20 is seated on the stage 10 so as to the through hole 610 of the vacuum pad 600 faces the port 21 of the FOUP 20, the upper surface of the sidewall 620 of the vacuum pad 600 makes contact with the periphery of the port 21 at the bottom of the FOUP 20. When the FOUP 20 is seated, the elastic member 380 elastically supporting the wing 320 of the base member 300 is compressed to reduce the impact, and the base member 300 descends below a predetermined interval along the guide pin 370.

At this time, as the base member 300 and the support member 400 is elastically supported upward by the elastic force of the elastic member 380, the vacuum pad 600 is elastically supported toward the periphery of the port 21 at the bottom of the FOUP 20.

In addition, when the vacuum exhaust is started through the exhaust hole 312 of the body 310 of the base member 300, the vacuum region is formed in the space between the pair of side walls 620 through the first vacuum exhaust hole 350, the second vacuum exhaust hole 440, and the vacuum hole 640. Therefore, the vacuum pad 600 is more tightly make close contact to the bottom of the FOUP 20 by the vacuum pressure to further improve the airtightness around the through hole 610.

After that, when the purge gas is injected through the gas injection hole 311 of the body 310 of the base member 300, the purge gas through the hollow hole 331 of the base member 300 and the purge hole 431 of the support member 400 and is discharged through the through hole 610 of the vacuum pad 600 and provided inside the FOUP 20 through the port 21 at the bottom of the FOUP 20. At this time, since the upper end of the sidewall 620 formed on the outside of the through hole 610 of the vacuum pad 600 is firmly attached to the bottom surface of the FOUP 20 by the vacuum pressure, the purge gas is prevented from leaking around the vacuum pad 600 beyond the sidewall 620. Therefore, it is possible to perform a purge process with a high concentration.

On the other hand, if the wafer processed in the semiconductor manufacturing apparatus is accommodated in the FOUP (20) again, the FOUP 20 is separated from the stage 10 after stopping supply of the purge gas and exhaust operation. At this time, the purge nozzle module 100 rises along the guide pin 370 by the elastic restoring force of the elastic member 380 and returns to a standby state waiting for seating of another FOUP 20.

What is claimed is:

1. A purge nozzle module for a load port, comprising:
   a nozzle body with a purge hole formed at a center thereof; and
   a vacuum pad combined with an upper side of the nozzle body, having a through hole connected to the purge hole formed therethrough, and making close contact with a bottom of a front opening unified pod (FOUP) by a vacuum pressure,
   wherein the nozzle body comprise:
      a gas injection hole connected to the purge hole and formed on one side thereof; and
      at least one exhaust hole spaced apart from the gas injection hole by a predetermined gap; and
   the vacuum pad has a vacuum hole connected to the exhaust hole.

2. The purge nozzle module of claim 1, wherein the vacuum pad further includes a pair of sidewalls spaced apart from each other by a predetermined distance along a circumference of the through hole, and a bottom surface formed between the pair of sidewalls and having the vacuum hole.

3. The purge nozzle module of claim 2, wherein the pair of sidewalls form concentric circles having different diameters with respect to the through hole as a center.

4. The purge nozzle module of claim 1, wherein the nozzle body comprises a base member with the gas injection hole formed one side thereof, and a support member which is combined with the base member, has the purge hole connected to the gas injection hole formed through a middle thereof, and is combined with the vacuum pad at an upper side thereof.

5. The purge nozzle module of claim 4, wherein the nozzle body further comprises:
   a second vacuum exhaust hole formed through a side of the purge hole and connected with the exhaust hole.

6. The purge nozzle module of claim 4, wherein the nozzle body further comprises:
a combining member combined to a stage to surround an outer side of an upper end of the base member and to guide a lifting direction of the base member.

7. The purge nozzle module of claim 4, wherein the base member comprises:
a body having a block shape; and
a first seating groove formed on an upper surface of the body, wherein the support member is seated on the first seating groove.

8. The purge nozzle module of claim 7, wherein the base member comprises:
a first boss protruding upward from a center of the first seating groove to be connected to the gas injection hole and having a hollow.

9. The purge nozzle module of claim 8, wherein the base member further comprises at least one exhaust hole formed spaced apart from the gas injection hole by a predetermined gap, and a first vacuum exhaust hole formed at a side of the first boss to be connected to the exhaust hole.

10. The purge nozzle module of claim 7, wherein the base member further comprises a pair of wing portions protruding from both sides of the body.

11. The purge nozzle module of claim 10, wherein the base member further comprises a guide pin installed vertically through the wing portion; and
an elastic member installed to surround a lower end of the guide pin to elastically support the base member.

12. The purge nozzle module of claim 7, wherein the support member comprises a seating portion inserted into the first seating groove, an extending portion formed to extend a width of the seating portion at an upper portion of the seating portion, and a second seating groove formed on an upper surface of the extending portion and into which the vacuum pad is inserted.

13. A purge nozzle module for a load port, comprising:
a nozzle body with a purge hole formed at a center thereof; and
a vacuum pad combined with an upper side of the nozzle body, having a through hole connected to the purge hole formed therethrough, and making close contact with a bottom of a front opening unified pod (FOUP) by a vacuum pressure,
wherein the nozzle body comprises a base member with the gas injection hole formed one side thereof, and a support member which is combined with the base member, has the purge hole connected to the gas injection hole formed through a middle thereof, and is combined with the vacuum pad at an upper side thereof;
wherein the base member comprises:
a body having a block shape;
a first seating groove formed on an upper surface of the body, wherein the support member is seated on the first seating groove; and
a first boss protruding upward from a center of the first seating groove to be connected to the gas injection hole and having a hollow; and
wherein the support member comprises:
a seating portion inserted into the first seating groove;
an extending portion formed to extend a width of the seating portion at an upper portion of the seating portion;

a second seating groove formed on an upper surface of the extending portion and into which the vacuum pad is inserted; and
a second boss protruding upward from a center of the second seating groove and having the purge hole into which the first boss is inserted.

14. The purge nozzle module of claim 13, wherein the base member further comprises at least one exhaust hole formed spaced apart from the gas injection hole by a predetermined gap, and a first vacuum exhaust hole formed at a side of the first boss to be connected to the exhaust hole, and
wherein the support member further comprises a second exhaust hole formed at a side of the second boss to be connected to the first vacuum exhaust hole.

15. The purge nozzle module of claim 13, wherein the support member further comprises:
an inner flange groove formed along a lower circumference of an outer circumferential surface of the second boss; and
an outer flange groove formed along a lower edge of an outer edge of the second seating groove.

16. The purge nozzle module of claim 15, wherein the vacuum pad comprises:
an inner sidewall and an outer sidewall formed spaced apart from each other in a radial direction along a circumference of the through hole;
a bottom surface formed between the inner sidewall and the outer sidewall;
a vacuum hole formed at the bottom surface;
an inner flange protruded inward along a circumference of the inner sidewall and inserted into the inner flange groove;
an outer flange protruded outward along a circumference of the outer sidewall and inserted into the outer flange groove; and
an inserting portion protruded downward along a circumference of the vacuum hole.

17. A purge nozzle module for a load port, comprising:
a nozzle body with a purge hole formed at a center thereof; and
a vacuum pad combined with an upper side of the nozzle body, having a through hole connected to the purge hole formed therethrough, and making close contact with a bottom of a front opening unified pod (FOUP) by a vacuum pressure,
wherein the nozzle body comprises:
a base member with the gas injection hole formed one side thereof;
a support member which is combined with the base member, has the purge hole connected to the gas injection hole formed through a middle thereof, and is combined with the vacuum pad at an upper side thereof; and
a combining member combined to a stage to surround an outer side of an upper end of the base member and to guide a lifting direction of the base member; and
wherein the combining member comprises:
a combining body having a rectangular plate shape;
a receiving hole formed through the combining body; and
a plurality of guide pin groove formed on a bottom surface of the combining body.

* * * * *